(12) United States Patent
Pidgeon, Jr.

(10) Patent No.: US 6,204,718 B1
(45) Date of Patent: Mar. 20, 2001

(54) METHOD AND APPARATUS FOR GENERATING SECOND-ORDER PREDISTORTION WITHOUT THIRD-ORDER DISTORTION

(75) Inventor: Rezin E. Pidgeon, Jr., Atlanta, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/337,029

(22) Filed: Jun. 25, 1999

(51) Int. Cl.[7] ....................................................... H03K 5/08
(52) U.S. Cl. .......................... 327/318; 327/317; 359/161
(58) Field of Search ..................................... 327/318, 317, 327/306; 359/161, 180, 188

(56) References Cited

U.S. PATENT DOCUMENTS

| | | | |
|---|---|---|---|
| 4,752,743 | * 6/1988 | Pham et al. | 330/149 |
| 4,992,754 | 2/1991 | Blauvelt et al. | 330/149 |
| 5,126,871 | * 6/1992 | Jeffers | 359/154 |
| 5,132,639 | 7/1992 | Blauvelt et al. | 330/149 |
| 5,172,068 | 12/1992 | Childs | 328/162 |
| 5,234,613 | 8/1993 | Shiflett | 252/67 |
| 5,282,072 | 1/1994 | Nazarathy et al. | 359/157 |
| 5,321,710 | 6/1994 | Cornish et al. | 372/26 |
| 5,361,156 | 11/1994 | Pidgeon | 359/161 |
| 5,373,384 | * 12/1994 | Hebert | 359/161 |
| 5,378,937 | * 1/1995 | Heidemann et al. | 327/306 |
| 5,418,637 | 5/1995 | Kuo | 359/161 |
| 5,424,680 | 6/1995 | Nazarathy et al. | 330/149 |
| 5,436,749 | 7/1995 | Pideon, Jr. et al. | 359/161 |
| 5,453,868 | * 9/1995 | Blauvelt et al. | 359/173 |
| 5,481,389 | 1/1996 | Pidgeon et al. | 359/161 |
| 5,798,854 | 8/1998 | Blauvelt et al. | 359/161 |
| 5,861,966 | 1/1999 | Ortel | 351/125 |

* cited by examiner

Primary Examiner—Timothy P. Callahan
Assistant Examiner—Hai L. Nguyen
(74) Attorney, Agent, or Firm—Kenneth M. Massaroni; Kelly A. Gardner; Hubert J. Barnhardt, III

(57) ABSTRACT

An embodiment includes an input node, a shunt impedance electrically connected to the input node, and at least one shunt diode connected in series with the shunt impedance. The input node receives an electrical signal from a signal generator. A bias current is applied to the shunt diode from a bias supply. In response, the shunt diode generates second-order distortion and substantially no third-order distortion. The level of bias current is adjusted to substantially eliminate any third-order distortion while the shunt impedance is adjusted so that the appropriate amount of second-order distortion is generated as predistortion. The predistortion is then provided to a nonlinear device, such as a laser, where it operates to substantially cancel inherent distortion generated by the nonlinear device.

17 Claims, 6 Drawing Sheets

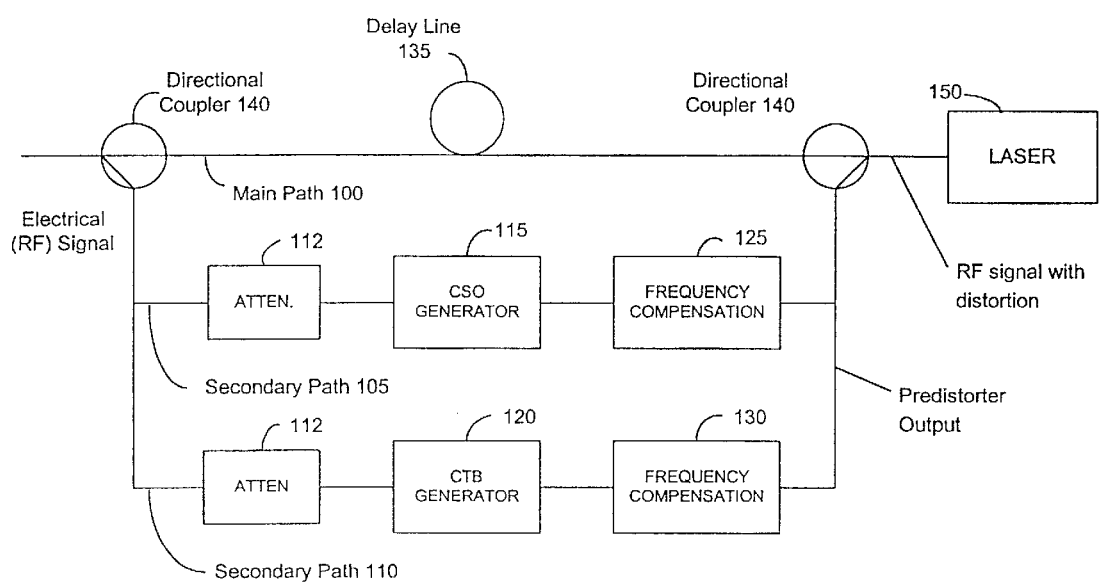
FIG. 1 - PRIOR ART

METHOD AND APPARATUS FOR GENERATING SECOND-ORDER PREDISTORTION WITHOUT THIRD-ORDER DISTORTION

TECHNICAL FIELD

The present invention generally relates to systems for distortion compensation signal linearization using predistortion, and more specifically, to systems for providing predistortion from a shunt element to a nonlinear device where the predistortion has second-order distortion and substantially no third-order distortion.

BACKGROUND OF THE INVENTION

Optical communications systems are well known in the art. A typical optical communication system may include a laser transmitter that converts an electrical signal into a modulated optical signal. The optical signal is carried over the optical-fiber link and converted back to an electrical signal by a photodetector in the optical receiver. Modulation of the optical signal may be accomplished by directly modulating the intensity of the laser via modulating the bias current in response to the electrical signal. This technique is referred to as direct modulation. A second method in common use for modulating the optical intensity is referred to as external modulation. With external modulation, the source laser is operated in the CW mode and its output is connected to an electro-optic modulator in which the optical intensity is modulated by the electrical signal. Both types of optically modulated systems are in common use in CATV systems.

CATV optical fiber transmission systems generally carry a large number of frequency-division multiplexed (FDM) analog and digital signals. One of the problems encountered by such systems is the need for linearity within the system. For example, such systems typically require a high degree of linearity in the electrical-to-optical modulation process and a high degree of linearity in the fiber link and optical receiver. Nonlinearity in a transmission results in undesirable impairments of the received television picture or loss of data in a digital application. For example, in CATV systems, composite second-order (CSO) distortion refers to the total distortion power in a channel due to second-order intermodulation of the radio frequency (RF) carriers. Distortion occurs at frequencies equal to the sum frequencies and the difference frequencies of the interfering carriers. Composite triple-beat (CTB), or third-order distortion, is the total distortion power in a channel due to third-order intermodulation of the RF carriers. In addition to the second-order and third-order distortions, higher-order distortions may occur to a lesser degree in transmissions.

One of the primary sources of nonlinearity or distortion is the electrical-to-optical converter. For directly modulated optical transmitters, the laser diode normally limits the achievable optical transmission performance. It is generally known that the laser diode, such as a distributed-feedback laser, typically introduces an amount of unwanted distortion to the optical signal. A laser diode produces distortion from several causes. A laser generally exhibits a static nonlinearity, which is evident in the nonlinearity of the laser light intensity characteristic as a function of electrical bias current. Static distortion is a function only of the instantaneous amplitude of the input to the laser, and is not frequency dependent.

Lasers also generate distortion from dynamic causes. These dynamic distortions are dependent not only on the distortion frequency, but also on the frequencies of the carriers that cause the distortion. In a nonlinear device, such as a distributed-feedback laser, the amplitude and phase of the distortion of each beat is a function of the amplitude and phase of each carrier that produced the distortion. In summary, nonlinear devices (such as lasers) inherently and undesirably generate distortion.

It is well known to use predistortion and post distortion techniques to cancel the inherent distortion generated in a nonlinear device. With predistortion, the electrical signal to be transmitted is fed to an ancillary circuit which generates distortion equal in magnitude to the distortion inherent in the nonlinear device, but of the opposite sign. In this manner, when the electrical signal and the generated distortion (called predistortion) pass through the nonlinear device, the generated distortion operates to cancel the inherent nonlinear distortion of the device due to the phase relationships and relative amplitudes of the two distortion components.

In general, predistortion circuits can be classified as having a parallel-branch circuit topology or an inline circuit topology. FIG. 1 is a simplified block diagram of the parallel-branch topology known in the prior art. Referring now to FIG. 1, parallel-branch predistortion circuits are characterized by a main path 100 for the electrical signal and a secondary path or paths 105, 110 for attenuators 112, the distortion generators 115, 120 and frequency-compensation adjustments 125, 130. A delay line 135 is normally included in the main path 100 for equalizing the delay between the main path 100 and the secondary paths 105,110.

Most parallel-branch second-order predistortion circuits are two-port circuits that generate second-order distortion and essentially no even-order distortion. Examples of parallel-branch predistortion circuits known in the art are shown in U. S. Pat. Nos. 5,361,156, 5,436,749, 5,481,389, 4,992,754, 5,132,639, 5,424,680, 5,418,637, 5,321,710, 5,243,613 and 5,252,930.

For the inline predistortion topology, the nonlinear elements are collectively considered to be one-port devices in series or in shunt with the primary path of the electrical signal. Both shunt and series elements may be used simultaneously in the primary path. The inline predistortion topology may have some advantages relative to the parallel-branch type predistortion circuits in simplicity and lower economic cost.

Patents and publications have described various implementations of one-port inline predistortion circuits. For example, U.S. Pat. No. 5,172,068 entitled "Third-Order Predistortion Linearization Circuit" issued on Dec. 15, 1992 to R. B. Childs discloses an inline predistorter circuit that cancels third-order distortion products produced by a nonlinear device, such as an optical transmitter. Additionally, U.S. Pat. No. 5,282,072 entitled "Shunt-Expansive Predistortion Linearizers for Optical Analog Transmitters" issued on Jan. 25, 1994 to M. Nazarathy, A. J. Ley, and H. C. Verhoeven discloses an inline predistorter circuit that suppresses third-order distortion products generated by another nonlinear device through the use of symmetrically configured diodes placed and biased back-to-back. Additionally, U.S. Pat. No. 5,703,530 entitled "Radio Frequency Amplifier Having Improved CTB and Cross Modulation Characteristics" issued on Dec. 30, 1997 to Sato, Yuzo, Kaneko, Katsumi, Saito, and Yasushi discloses inline predistortion circuits for canceling frequency dependent third-order distortions.

As described above, most one-port inline predistorter circuits known in the art relate primarily to third-order compensation of externally modulated optical transmitters.

An inline second-order predistortion circuit is disclosed in U.S. Pat. No. 5,119,392 entitled "Second-Order Predistortion Circuit for Use with Laser Diode" issued Jun. 2, 1992 to Richard B. Childs. However, in this disclosure, distortion is generated in a two-port device and there are no means for eliminating unwanted third-order distortion from the distortion generator. Furthermore, U.S. Pat. No. 5,798,854 entitled "Inline Predistorters for Linearization of Electronic and Optical Signals" issued on Aug. 25, 1998 to H. A. Blauvelt and M. Regehr describes one-port inline predistorter circuits that compensate for both second-order and third-order distortion using a real distorter and an imaginary distorter.

In summary, there is a need for an equivalent one-port inline predistorter capable of substantially canceling second-order distortion generated by a nonlinear device, such as a distributed-feedback laser in a CATV system, but does not generate third-order distortion.

BRIEF DESCRIPTION OF THE DRAWINGS

The accompanying drawings, which are incorporated in and constitute a part of this specification, illustrate embodiments of the invention, and together with the description, explain the advantages and principles of the invention.

FIG. 1 is a block diagram illustrating a prior art parallel branch predistorter;

Figure 2A:
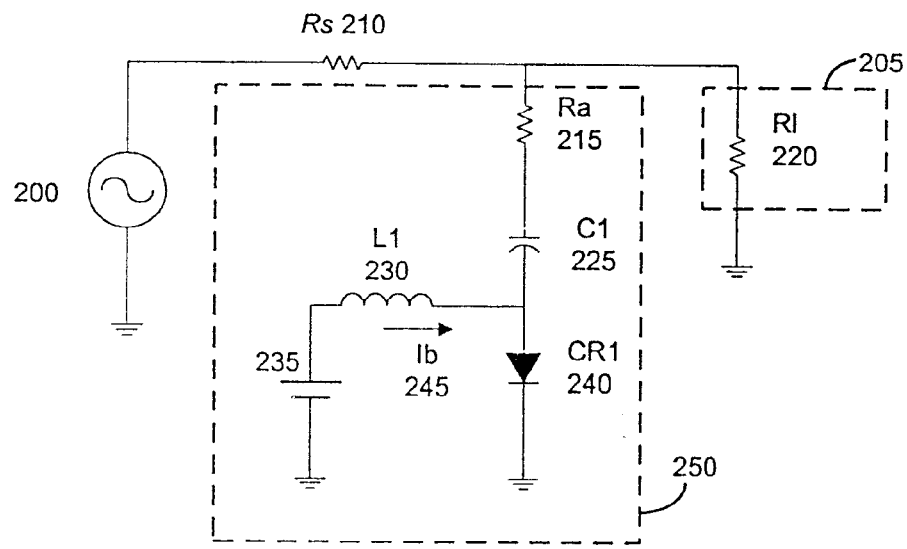
FIG. 2a is a diagram illustrating an exemplary embodiment of a Schottky diode shunt predistorter circuit consistent with an embodiment of the present invention.

It is to be understood that both the foregoing general description and the following detailed description are exemplary and explanatory only and are not restrictive of the invention, as claimed. The following description, as well as the practice of the invention, set forth and suggest additional advantages and purposes of this invention.

DETAILED DESCRIPTION OF THE PREFERRED EMBODIMENTS

Reference will now be made to various embodiments according to this invention, examples of which are shown in the accompanying drawings and will be apparent from the description of the invention. In the drawings, the same reference numbers represent the same or similar elements in the different drawings whenever possible.

It is known that predistorter circuits are used to introduce distortion (generally called predistortion) to an electrical signal prior to applying the electrical signal to a nonlinear device, such as a directly-modulated DFB laser, so that the predistortion cancels inherent distortion generated by the nonlinear device. In practice, most inline predistorters generate either only third-order distortion or a combination of second-order distortion and third-order distortion as predistortion to suppress the nonlinear device's inherent distortion. The applicant has discovered that an improved inline one-port predistortion circuit consistent with an embodiment of the present invention uses shunt elements to generate second-order distortion while generating substantially no third-order distortion. Such an inline predistortion circuit simplifies the complexity of any known second-order only predistorter and may reduce costs of such predistortion.

Figure 2B:
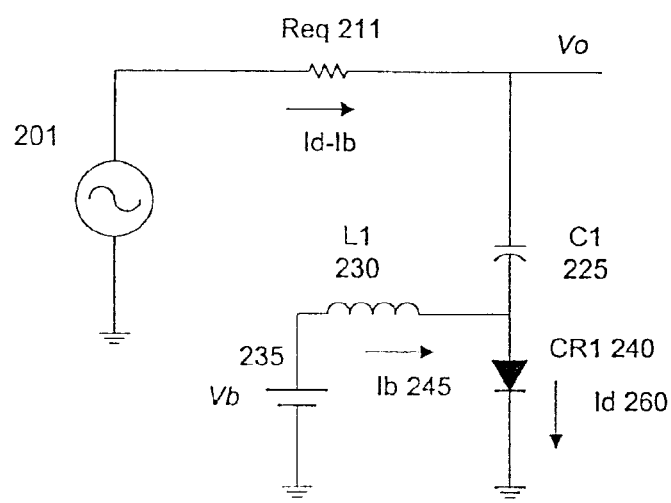
FIG. 2b is a diagram illustrating an exemplary embodiment of an electrically equivalent circuit of the Schottky diode shunt predistorter circuit consistent with an embodiment of the present invention.
Figure 3:
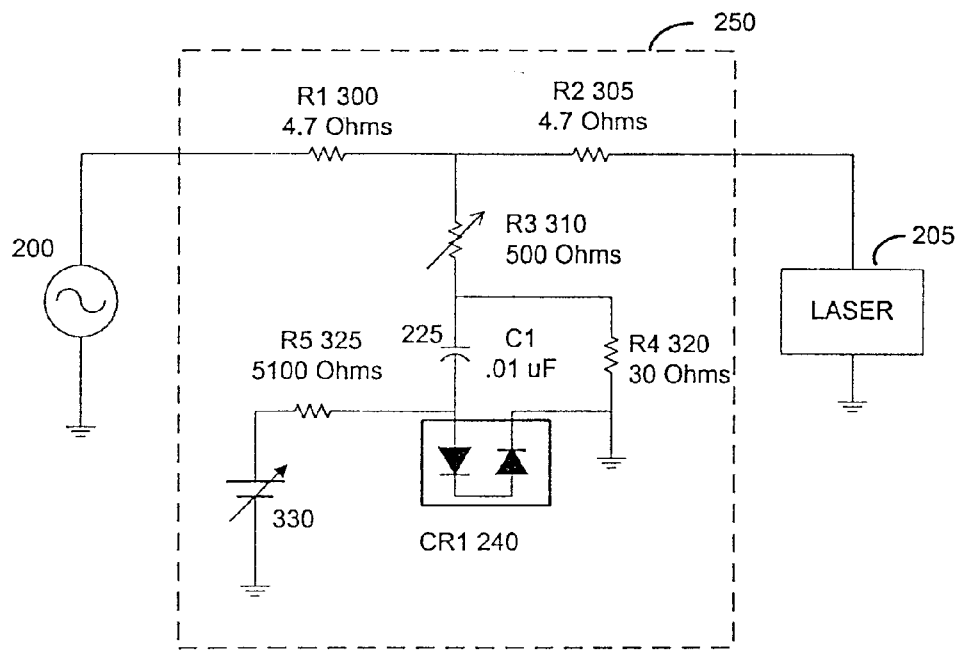
FIG. 3 is a diagram illustrating another exemplary embodiment of a Schottky diode shunt predistorter circuit consistent with an embodiment of the present invention.
Figure 4A:
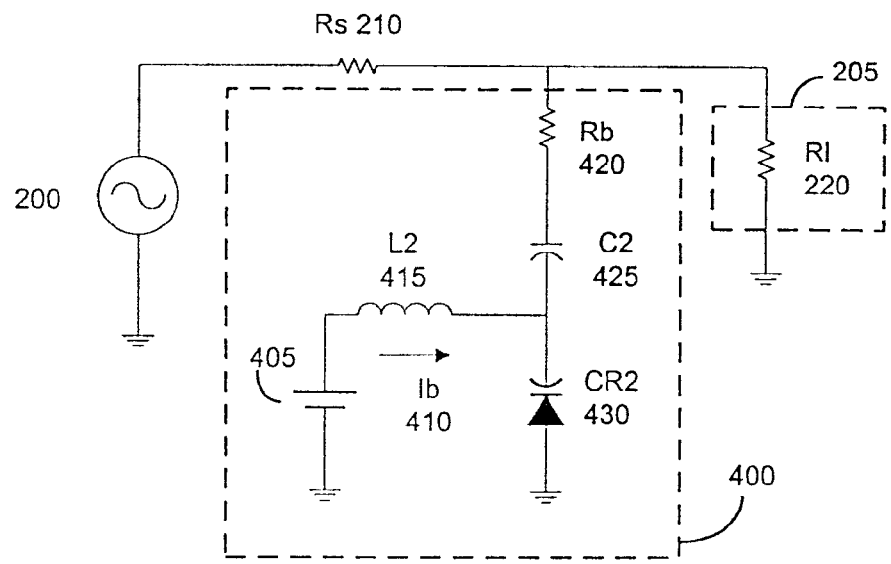
FIG. 4a is a diagram illustrating an exemplary embodiment of a varactor diode shunt predistorter circuit consistent with an embodiment of the present invention.
Figure 4B:
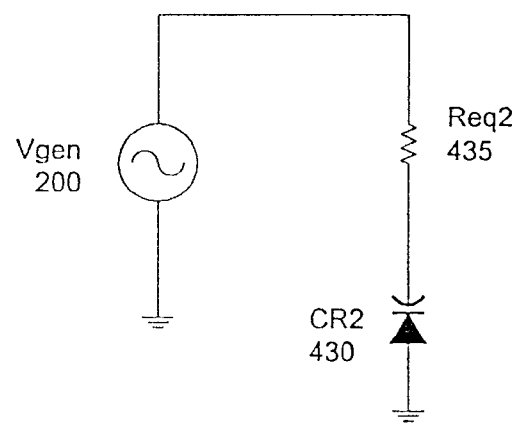
FIG. 4b is a diagram illustrating an exemplary embodiment of an electrically equivalent circuit of the varactor diode shunt predistorter circuit consistent with an embodiment of the present invention.
Figure 5:
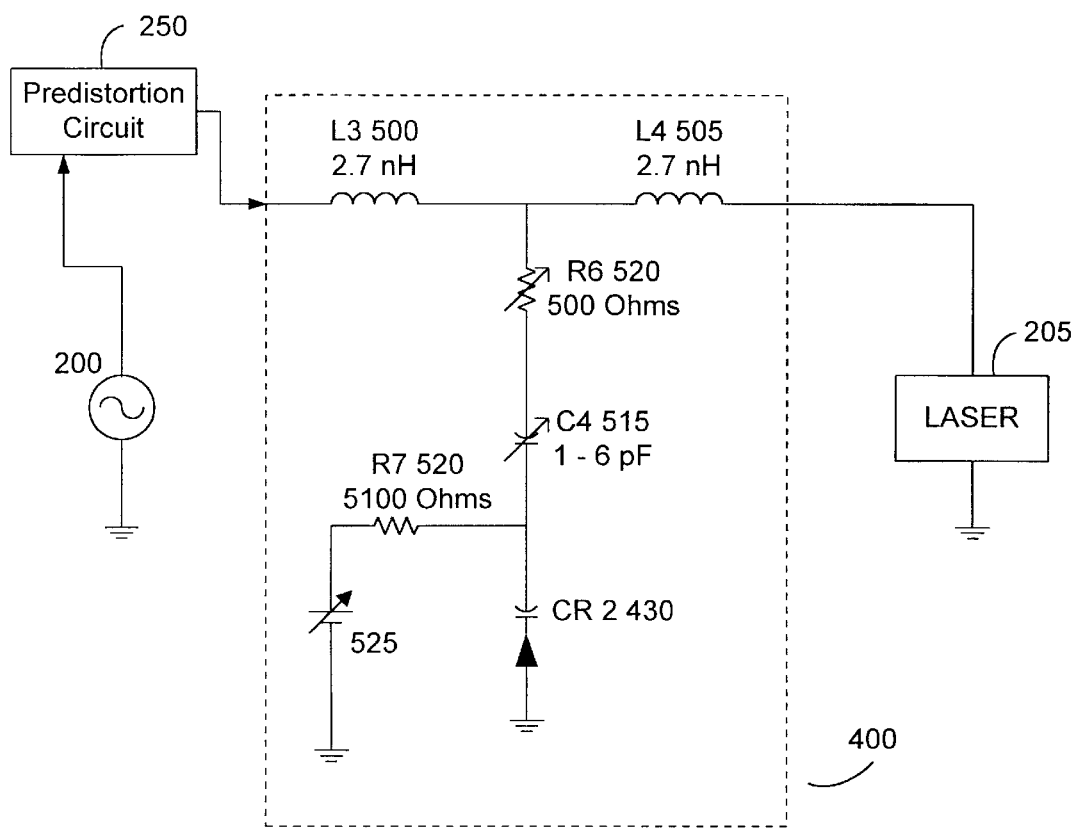
FIG. 5 is a diagram illustrating another exemplary embodiment of a varactor diode shunt predistorter circuit consistent with an embodiment of the present invention.
Figure 6:
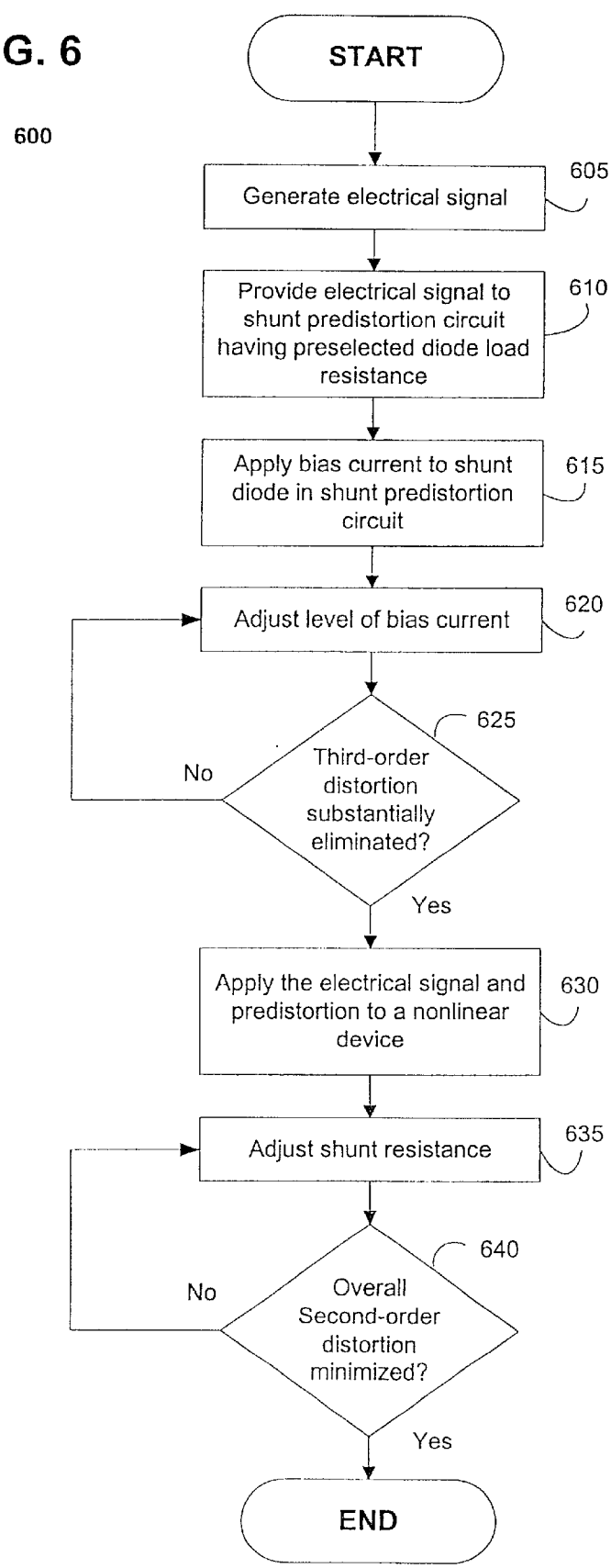
FIG. 6 is a flow diagram illustrating steps for generating predistortion having second-order distortion and substantially no third-order distortion from a shunt predistortion circuit consistent with an embodiment of the present invention.

In summary, FIG. 1 is a block diagram illustrating a prior art parallel branch predistorter. FIGS. 2a, 2b, and 3 illustrate various embodiments of a Schottky diode shunt predistorter circuit consistent with embodiments of the present invention. FIGS. 4a, 4b, and 5 illustrate various embodiments of a varactor diode shunt predistorter circuit consistent with embodiments of the present invention. Finally, FIG. 6 illustrates steps from an exemplary method for generating predistortion having second-order distortion and substantially no third-order distortion in accordance with an embodiment of the present invention.

Essentially, predistorting a nonlinear device, such as a directly modulated DFB laser, is accomplished by placing one or more nonlinear elements in series or in shunt with the electrical path connecting the electrical signal to the nonlinear device. FIG. 2a is a general illustration of a shunt Schottky diode circuit capable of generating predistortion to compensate for the static second-order nonlinearity of the laser in accordance with an embodiment of the present invention.

Referring now to FIG. 2a, an electrical signal is represented by the output of a signal source, such as signal generator 200. In general, signal generator 200 is connected to a one-port predistortion circuit 250, which is then connected to a nonlinear device 205. Typically, the electrical signal from signal generator 200 modulates nonlinear device 205. By introducing the electrical signal to nonlinear device 205 along with predistortion from one-port predistortion circuit 250, the inherent distortion generated by nonlinear device 205 can be effectively canceled.

In more detail, the impedance of signal generator 200 is schematically represented by Rs 210. Nonlinear device 205 is schematically represented by Rl 220, which is the effective load impedance of nonlinear device 205. The signal at the junction of Rs 210 and Rl 220 is connected through a shunt resistance Ra 215 and blocking capacitor C1 225 to a shunt diode CR1 240, which is preferably a Schottky diode.

A bias source, such as bias supply 235, provides a bias current 245 to bias and control shunt diode CR1 240. Inductor L1 230 serves to isolate the electrical signal across CR1 240 from the bias supply 235, and blocking capacitor C1 225 serves to isolate the bias current 245 supplied to CR1 240 from the source 200 and load 205. The junction between CR1 240, blocking capacitor C1 225 and inductor L1 230 is deemed to be a bias node within circuit 250.

The electrical signal from generator 200 is applied to the laser 205 and to the one-port predistortion circuit 250. In other words, the electrical signal (typically an RF signal) is applied to Rl 220 and to CR1 240 through Ra 215. With diode CR1 240 being biased by bias supply 235, nonlinear currents are generated by CR1 240 in response to the voltage drop across diode CR1 240. The nonlinear currents generated by diode CR1 240 flow through the load and generator 200 through Ra 215 and C1 225. The objective is for the nonlinear current generated by diode CR1 240 to produce distortion and provide this distortion (called predistortion) to the laser 205. This predistortion then operates to cancel the inherent distortion generated by the laser 205.

For a better understanding of how the particular distortion components are generated within one-port predistortion circuit 250, analysis of circuit 250 using a conventionally determined Thevenin equivalent of circuit 250 is instructive. FIG. 2b is a Thevenin equivalent circuit for calculating the distortion generated by the diode CR1 240 from circuit 250 illustrated in FIG. 2a. Referring now to FIG. 2b, equivalent source 201 (also referred to as U) and Req 211 are the Thevenin equivalent source voltage and source resistance as seen from CR1 240, respectively. Those skilled in the art will appreciate that according to conventional circuit analysis, Req 211 is equal to (Rs 210) (/2+(Ra 215) for Rs 210=RI 220. Assuming the diode series resistance within diode CR1 240 is negligible, the diode current Id 260 can be approximated as follows:

$$Id = Is \cdot \exp\left(\frac{qV}{n \cdot k \cdot T}\right) \quad \text{(EQ. 1)}$$
$$= Is \cdot \exp\left(\frac{Vb + Vo}{Vt}\right)$$
$$= Ib \cdot \exp\left(\frac{Vo}{Vt}\right)$$

where Is is the diode saturation current within CR1 240, Vb is the dc bias voltage of bias supply 235, Ib is the value of dc bias current 245, q is electron charge, k is a constant known in the electrical arts as Boltzmann's constant, n is the diode ideality factor (nominally 1.0), and T is temperature in degrees Kelvin. Vo is the AC voltage across the diode and is given by the following equation:

$$Vo = U - (Id - Ib) \cdot Req \quad \text{(EQ. 2)}$$
$$= U - Ib \cdot Req \cdot \exp\left(\frac{Vo}{Vt}\right) + Ib \cdot Req$$

In order to illustrate how second-order distortion is generated by one-port predistortion circuit 250 while substantially no third-order distortion is generated, an analysis of the AC voltage (Vo) across the shunt diode (e.g., diode CR1 240) is helpful. To begin the analysis, Vo is represented by a conventional power series in U (e.g., equivalent source 201):

$$Vo = \sum_k a(k) \cdot U^k \quad \text{(EQ. 3)}$$
$$= U - Ib \cdot Req \cdot \exp\left[\frac{1}{Vt} \cdot \left(\sum a(k) \cdot U^k\right)\right] + Ib \cdot Req.$$

When the exp( ) term of the above equation (EQ. 3) is expanded up through k=3, the following mathematical representation of the diode's AC voltage is revealed:

$$Vo = U - Ib \cdot Req\left[1 + \frac{1}{Vt} \cdot \sum a(k) \cdot U^k + \frac{1}{2!V_t^2} \cdot \left(\sum a(k) \cdot U^k\right)^2 + \quad \text{(EQ. 4)}$$
$$\frac{1}{3!V_t^3} \cdot \left(\sum a(k) \cdot U^k\right)^3\right] + Ib \cdot Req.$$

As a result, the expanded equation for Vo (EQ. 4) now represents various components of predistortion generated when diode CR1 240 is biased by current Ib 245.

Collecting first-order terms (k=1) and solving for a1 in EQ. 4 gives the following:

$$a1 = \frac{1}{1 + \frac{Ib \cdot Req}{Vt}}. \quad \text{(EQ. 5)}$$

Collecting second-order terms (k=2) and solving for a2 in EQ. 4 gives the following:

$$a2 = \frac{-1}{2} \cdot \frac{Ib \cdot Req}{Vt^2} \cdot a1^3. \quad \text{(EQ. 6)}$$

Expanding and collecting third-order terms, and solving for a3 in EQ. 4 gives the following:

$$a3 = \frac{Ib \cdot Req}{Vt^3} \cdot a1^2 \cdot \left(a2 + \frac{1}{6} \cdot \frac{a1^2}{Vt}\right). \quad \text{(EQ. 7)}$$

Accordingly, those skilled in the art will appreciate that solving for Ib (e.g., bias current 245 from bias supply 235) in EQ. 7 when a3 is zero or substantially small advantageously determines the condition for cancellation of third-order distortion products. In other words, when Ib=Vt/(2*Req), the diode in one-port shunt predistortion circuit 250 (CR1 240) generates second-order distortion voltage across the diode equal to a2*U² while substantially no third distortion voltage is generated. This concentrates the predistortion on second-order products for suppression of second-order inherent distortion generated by laser 205. When one port predistortion circuit 250 is optimized for no third-order distortion, the distortion voltage across the diode is $$\frac{-1}{4Vt} \cdot a1^3 \cdot U^2,$$

and the distortion voltage across the load is $$a2 \cdot U^2 \cdot \frac{Rs/2}{Rs/2 + Ra}.$$

The sign of a2 is negative, which is correct for compensating nonlinear devices, such as laser 205, with a superlinear LI characteristic (second derivative of the LI curve is positive). For compensation of sublinear lasers, an equivalent series representation of the shunt-diode circuit would be used. Experience shows the majority of lasers for analog CATV applications can be compensated with the shunt-diode equalizer.

Although one-port predistortion circuit 250 can be advantageously adjusted to generate substantially no third-order distortion, it can also be adjusted to cancel a small amount of composite-triple-beat (CTB) distortion while primarily maintaining cancellation of composite-second-order (CSO) distortion. This is accomplished by adjusting the shunt resistance, Ra 215, and the bias current, Ib 245. Theoretical analysis and results of experimentation show that CSO is a strong function of shunt resistance Ra 215 while CTB is a strong function of diode bias current Ib 245 and the interaction between the two different adjustments has been found to be relatively small.

FIG. 3 shows an exemplary embodiment of the one-port predistorter circuit 250 implemented as a Schottky diode shunt predistorter circuit consistent with an embodiment of the present invention. Referring now to FIG. 3, resistors R1 300 and R2 305 along with the effective resistance of the shunt circuit (potentiometer R3 310, resistor R4 320 and diode CR1 240) form a low loss matched attenuator. In the example illustrated in FIG. 3, R1 300 and R2 305 are 4.7 Ohms forming a matched attenuator of about 1–2 dB.

Impedance R3 310 is preferably a potentiometer (or PIN diode equivalent) to adjust the voltage attenuation of the portion of the electrical signal feeding the diode CR1 240 and the distortion from the diode CR1 240 to the laser 205. In the example illustrated in FIG. 3, R3 310 is set to approximately 500 Ohms and diode CR1 240 is preferably implemented with a Hewlett-Packard Model HSMS-8202 Schottky diode pair. The diode pair (instead of a single diode) is preferably used to achieve a desirable impedance level and minimize diode RF parasitics.

R4 320, typically in the range of 30–50 Ohms, provides diode CR1 240 with a low source impedance for optimum bias current Ib 245 and optimum equivalent source resistance Req 211 in accordance with the previous equations. In an embodiment of the invention, the value of R4 320 is preferably selected depending on the expected voltage range and distortion level required to sufficiently cancel the inherent distortion generated by the laser 205. In the example illustrated in FIG. 3, R4 320 is 30 Ohms.

Additionally, R3 310 and Ib 245 can be adjusted for optimum distortion cancellation. Ib 245 is typically adjusted for minimum third-order distortion generated by diode CR1 240 as described above. R3 310 is adjusted for minimum overall CSO when combined with the inherent distortion generated by laser 205. In an exemplary embodiment, R3 310 is adjusted to achieve minimum overall CSO at lower RF frequencies (such as 50 MHz to 120 MHz) while a varactor circuit (such as the varactor circuit described illustrated in FIG. 5) is optimized to achieve minimum CSO at higher frequencies (such as 450 MHz to 750 MHz). In other words and more generally stated, the predistortion generated by the shunt predistortion circuit 205 is essentially constant over the entire frequency band while the predistortion generated by the varactor circuit is generally proportional to frequency and reaches its greatest value at the highest frequency.

As previously mentioned, a varactor circuit can provide additional predistortion, such as second-order distortion, with which to compensate for a laser's inherent dynamic distortion. In conjunction with the shunt distortion circuit 205 described above, the varactor circuit simply functions as another one-port predistorter connected to the same inline electrical path from generator 200 to laser 205. FIGS. 4a, 4b, and 5 illustrate exemplary varactor circuits capable of generating predistortion that is offset in phase (typically 90 degrees), dynamic, and concentrated in a higher frequency band when compared to static predistortion generated by the shunt predistortion circuit 205.

FIG. 4a is a simplified illustration of an exemplary shunt varactor diode circuit that compensates for frequency-dependent second-order nonlinearity of laser 205. Referring now to FIG. 4a, the electrical signal is again represented by the output of signal generator 200, which has a characteristic source impedance labeled as Rs 210. The laser 205 (more generally referred to as a nonlinear device) is characterized as load impedance Rl 220. The signal at the junction of Rs 210 and Rl 220 is connected to shunt varactor diode circuit 400, which generates predistortion to cancel inherent distortion generated by laser 205.

In more detail, the signal at the junction of Rs 210 and Rl 220 is connected through resistor Rb 420 to varactor diode CR2 430. Inductor L2 415 serves to isolate the electrical signal across CR2 430 from the bias supply 405, and capacitor C2 425 isolates the dc voltage 245 from the generator 200 and laser 205.

FIG. 4b is a Thevenin equivalent circuit for calculating the nonlinearity (e.g., predistortion) generated by varactor CR2 430 in response to the input electrical signal from circuit 400 illustrated in FIG. 4b. Referring now to FIG. 4b, those skilled in the art will appreciate that impedance Req2 435 is the Thevenin equivalent source resistance seen from the varactor diode CR2 430. The value of the electrical signal produced by generator 200 is labeled Vgen. Thus, as the electrical signal is applied to Req2 435, CR2 430 generates distortion that can be used as predistortion with the laser's own inherent distortion.

In an analysis of the distortion generated by varactor diode CR2 430, those skilled in the art will appreciate that the charge Q on a capacitor C is given by the equation Q=CV, where V is the voltage across the capacitor. The current I 440 through the capacitor is given by:

$$I = \frac{dQ}{dt} \quad (EQ.\ 8)$$
$$= C \cdot \frac{dV}{dt} + V \cdot \frac{dC}{dt}$$
$$= C \cdot \frac{dV}{dt} + V \cdot \frac{dC}{dV} \cdot \frac{dV}{dt}$$
$$= Co \cdot \frac{dV}{dt} + Cx \cdot V \cdot \frac{dV}{dt}.$$

where Co is the static capacitance at voltage V, and $$Cx = \frac{dC}{dV}.$$

The first term in EQ. 8 represents the linear response to the voltage of the electrical signal (constant capacitance) while the second term in EQ. 8 gives the nonlinear response due to modulation of the varactor capacitance by the voltage of the electrical signal. Thus, the nonlinear current 440 is expressed by:

$$I = Cx \cdot V \cdot \frac{dV}{dt}. \quad (EQ.\ 9)$$

The voltage across the capacitor is given by:

$$V(j\omega) = Vgen \cdot H(j\omega) \quad (EQ.\ 10)$$
where
$$H(j\omega) = \frac{1}{1 + j\omega \cdot Req2 \cdot Co} \quad (EQ.\ 11)$$

In EQ. 11, when Vgen=A·[cos(ω1·t)=cos(ω2·t)], solving for $$V \cdot \frac{dV}{dt}$$

provides a general solution for distortion generated by the varactor diode CR2 430.

Expanding and collecting second-order terms yields the second-order distortion component of Id:

$$Id = \frac{1}{2} A^2 \cdot Cx \cdot |H1| \cdot |H2| \cdot \left[ (\omega 2 \pm \omega 1) \cdot t + \frac{\pi}{2} \arg(H1) + \arg(H2) \right]. \quad \text{(EQ. 12)}$$

For the case $j\omega \cdot \text{Req2} \cdot Cx \ll 1$, $$Id \cong \frac{1}{2} A^2 \cdot Cx \cdot (\omega 2 \pm \omega 1) \cdot \cos\left[(\omega 2 \mp \omega 1) \cdot t + \frac{\pi}{2}\right], \quad \text{(EQ. 13)}$$

and the distortion is dependent on the distortion frequency but not on the individual frequencies of the intermodulation-frequency pairs. Furthermore, the distortion generated by the varactor diode CR2 430 advantageously leads the phase of the Vgen fundamental components by approximately 90 degrees. By reversing the polarity of the varactor diode, the phase of the distortion generated may be made to lag by 90 degrees. For the case that $j\omega \cdot \text{Req2} \cdot Cx$ is not negligible, amplitude and phase dispersion exists in the distortion beats in a given RF channel.

FIG. 5 is a schematic of an exemplary embodiment of the varactor-diode predistorter 400 in accordance with the present invention. As mentioned above, another one-port predistorter circuit 250, such as that shown in FIG. 2 or FIG. 3, can be included in the inline electrical path from generator 200 to laser 205 to provide additional predistortion. Varactor CR2 430 is preferably implemented using a Toshiba Model 12V245 diode. Inductors L3 500 and L4 505 with the static capacitance (Co) of the varactor diode 430 basically form a constant impedance delay circuit to minimize mismatch due to the varactor capacitance. In the example illustrated in FIG. 5, the inductance value of L3 and L4 is 2.7 nH for each.

R6 510 is a potentiometer (or PIN diode equivalent) to adjust the voltage attenuation factor $Hj(\omega)$. R7 520 is a large-value resistor used to isolate the bias supply from the varactor. In the example illustrated in FIG. 5, the resistance value of R6 is preferably set to 500 Ohms while R7 520 is preferably a 5.1 kOhm resistor.

Variable capacitor C4 515 (typically in the range of 1 to 6 pf) interacts with adjustable varactor bias supply 525 to control the parameters Co and Cx of CR2 430. The particular values for parameters Co and Cx will vary depending upon the bias voltage 525 applied to CR2 430, the specific varactor diode selected for use in circuit 400, and the level of predistortion required.

Potentiometer R6 510 controls the RC time constant of $Hj(\omega)$. Varying the time constant of $Hj(\omega)$ alters the frequency dependency and dispersion of the distortion generated by circuit 400 and applied to laser 205. If predistortion is desired without phase-amplitude dispersion, $H(\omega)$ may be set to zero Ohms for predistortion.

Therefore, the distortion current (Id) generated in the varactor diode CR2 430 is impressed through C4 515 and R6 510 before it is applied to laser 205. In this manner, it is possible to suppress second-order distortion in a higher frequency band when compared to the second-order distortion addressed by one-port predistorter circuit 250.

Another aspect of the present invention is a method for generating predistortion having second-order distortion and substantially no third-order distortion. FIG. 6 is a flow diagram illustrating steps for generating predistortion having second-order distortion and substantially no third-order distortion from a shunt predistortion circuit consistent with an embodiment of the present invention. As shown in FIG. 6, the method 600 begins at step 605 where an electrical signal is generated. In the exemplary embodiment, the electrical signal is an RF signal used to modulate laser 205.

At step 610, the electrical signal is provided to a shunt predistortion circuit having a preselected diode load resistance. In the exemplary embodiment, generator 200 provides the electrical signal to one-port Schottky diode predistortion circuit 250. Circuit 250 has a diode load resistance R4 320 that has been advantageously selected according to an expected voltage range of the electrical signal and an expected distortion level. Typically, R4 320 is in the range of 30–50 Ohms in order to provide an optimum bias current which is empirically found to generate an appropriate amount of predistortion.

In general, the application of voltage from generator 200 to the diode causes the diode to generate predistortion and then steps 615–630 adjust certain circuit parameters so that the generated predistortion effectively cancels the inherent distortion generated by a nonlinear device, such as a laser. In more detail, at step 615, a bias current is applied to a shunt diode within the shunt predistortion circuit. In the exemplary embodiment, bias supply 330 is an adjustable voltage supply capable of providing the bias current to shunt diode CR1 240. The bias current is nominally applied at 0.5 to 1.0 mA.

At step 620, the shunt resistance is adjusted to minimize second-order distortion. In the exemplary embodiment, potentiometer R3 310 is adjusted to alter the voltage attenuation of the electrical signal feeding into the shunt predistortion circuit. In this manner, the potentiometer R3 310 is adjusted for the minimum amount of second-order distortion coming from the shunt diode to laser 205.

At step 625, if the third-order distortion component is substantially eliminated from the predistortion, method 600 terminates with the predistortion circuit being properly activated and generating the appropriate amount of predistortion. Otherwise, the bias current and shunt resistance are not properly set and step 625 proceeds to step 630.

At step 630, the level of bias current is adjusted within the shunt predistortion circuit for minimum third-order predistortion. After adjusting for minimum third-order distortion, step 630 returns to step 620 where the shunt resistance is again adjusted to minimize third-order distortion to effectively cancel the inherent distortion generated by the nonlinear device.

Additionally, if a varactor circuit is used in conjunction with a shunt diode predistorter circuit, the varactor circuit is simply configured as another shunt element from the inline electrical path between generator 200 and laser 205. Additional predistortion from the varactor circuit can be used in conjunction with the shunt diode's predistortion to substantially cancel the inherent distortion generated by the nonlinear device. It is preferred that, when using both the varactor circuit and the shunt diode circuit, the predistortion generated by the varactor is concentrated in a higher frequency band when compared to the predistortion generated of the shunt diode.

In summary, an exemplary embodiment of the present invention is part of the transmitter section of an optical transmission system and includes a signal source (e.g., signal generator 200) and a nonlinear device (e.g., laser 205). Predistortion is added to the electrical signal provided by generator 200, both of which are then provided to laser 205 to help linearize its output or reduce the laser's inherent distortion. To provide such predistortion, the applicant has discovered that an improved inline one-port predistortion circuit 250 consistent with an embodiment of the present invention uses one or more shunt elements to generate second-order distortion while generating substantially no third-order distortion. In particular, bias supply 330 provides a bias current to shunt diode CR1 240, which generates predistortion. The level of bias current is adjusted to substantially eliminate third-order distortion within the predistortion. Additionally, shunt resistance within the predistortion circuit 250 is adjusted so that an appropriate amount of second-order distortion is generated as predistortion. The predistortion is then provided to laser 205 where it operates to substantially cancel inherent distortion generated by the laser 205 itself. In this manner, the improved inline one-port predistortion circuit 250 linearizes the output of laser 205 using second-order distortion but without the need to use third-order distortion and without the need to resort to a two-port circuit topology, such as parallel-branch circuit topology. Such an inline predistortion circuit 250 simplifies the complexity of any known second-order only predistorter and may reduce costs of providing this type of predistortion.

A varactor circuit 400 may also be used in conjunction with circuit 250 in order to improve on linearization across many frequencies. In other words, the varactor circuit 400 may generate predistortion concentrated on higher frequencies while the shunt diode predistortion circuit 250 may generate predistortion concentrated on lower frequencies.

It will be apparent to those skilled in the art that various modifications and variations can be made to the apparatus and method of the present invention without departing from the spirit or scope of the invention. For example, the Schottky diode implemented predistortion circuit 250 depicted in FIG. 3 is intended to be exemplary of preferred embodiments. The precise circuitry capable of generating predistortion may readily be altered by one of ordinary skill in the art to obtain the equivalent predistorter as disclosed herein without departing from the spirit or scope of this invention. Thus, the present invention covers the modifications and variations of this invention provided they come within the scope of the appended claims and their equivalents.

What is claimed is:

1. An apparatus for providing predistortion to a nonlinear device along an in-line electrical path between a signal source and the nonlinear device, the apparatus comprising a shunt element electrically connected between the in-line electrical path and a ground, the shunt element being operative to generate second-order distortion as the predistortion and to generate substantially no third-order distortion, wherein:
    the shunt element has an adjustable resistance value and comprises a shunt impedance in series with a shunt diode;
    the apparatus further comprises a bias source connected to, and providing a bias current to, the shunt diode, wherein the bias source is capable of varying a magnitude of the bias current; and
    the shunt impedance and the shunt diode are collectively operative to generate the second-order distortion and to generate substantially no third-order distortion when the adjustable resistance value of the shunt impedance is a first value and the magnitude of the bias current provided to the shunt diode is a first current level.

2. The apparatus of claim 1, wherein the second-order distortion is capable of substantially canceling distortion generated by the nonlinear device.

3. The apparatus of claim 1, wherein the shunt diode is a Schottky diode.

4. An apparatus for providing predistortion to a nonlinear device along an in-line electrical path between a signal source and the nonlinear device, the apparatus comprising a shunt element electrically connected between the in-line electrical path and a ground, the shunt element being operative to generate second-order distortion as the predistortion and to generate substantially no third-order distortion, wherein:
    the shunt element has an adjustable resistance value and comprises a shunt impedance in series with a shunt diode;
    the apparatus further comprises a bias source connected to, and providing a bias current to, the shunt diode, wherein the bias source is capable of varying a magnitude of the bias current; and
    the shunt impedance and the shunt diode are collectively operative to generate the second-order distortion and to generate third-order distortion as the predistortion when the adjustable resistance value of the shunt impedance is a second value and the magnitude of the bias current provided to the shunt diode is a second current level.

5. An apparatus for providing predistortion to a nonlinear device along an in-line electrical path between a signal source and the nonlinear device, the apparatus comprising a shunt element electrically connected between the in-line electrical path and a ground, the shunt element being operative to generate second-order distortion as the predistortion and to generate substantially no third-order distortion, wherein:
    the shunt element has an adjustable resistance value and comprises a shunt impedance in series with a shunt diode; and
    the apparatus further comprises:
        a bias source connected to, and providing a bias current to, the shunt diode, wherein the bias source is capable of varying a magnitude of the bias current; and
        a varactor circuit electrically connected between the in-line electrical path and the ground, the varactor circuit being operative to generate additional second-order distortion in an offset-phase relationship when compared to the second-order distortion generated by the shunt element.

6. The apparatus of claim 5, wherein the second-order distortion generated by the shunt element and the additional second-order distortion generated by the varactor circuit combine to be the predistortion which substantially cancels the distortion introduced by the nonlinear device.

7. A predistortion circuit comprising:
    an input node for receiving an electrical signal;
    a shunt impedance electrically connected to the input node, wherein the shunt impedance comprises a shunt capacitor and a shunt resistance having an adjustable resistance value, the shunt resistance being coupled to the input node;
    at least one shunt diode connected in series with the shunt impedance, wherein the shunt capacitor is coupled between the shunt resistance and the at least one shunt diode; and
    a bias source connected to a bias node between the shunt capacitor and the at least one shunt diode, the bias source providing a bias current to the bias node for forward biasing the at least one shunt diode, and the bias source comprising an inductive element connected to the bias node and coupled in series with a voltage source, the voltage source capable of supplying the bias current to the at least one shunt diode through the inductive element, wherein the shunt impedance and the at least one shunt diode are collectively operative to generate second-order distortion out of the input node and to generate substantially no third-order distortion when the adjustable resistance value of the shunt resistance is a first predefined value and the magnitude of the bias current provided to the at least one shunt diode is a first predetermined level.

8. The predistortion circuit of claim 7, wherein the bias source is capable of varying a magnitude of the bias current.

9. The predistortion circuit of claim 8, wherein the at least one shunt diode is a Schottky diode.

10. The predistortion circuit of claim 7, wherein the shunt impedance and the at least one shunt diode are collectively operative to generate the second-order distortion and to generate third-order distortion as the predistortion when the adjustable resistance value of the shunt resistance is a second predefined value and the magnitude of the bias current provided to the at least one shunt diode is a second predetermined level.

11. A predistortion circuit comprising:

an input node for receiving an electrical signal;

a shunt impedance electrically connected to the input node;

at least one shunt diode connected in series with the shunt impedance, the shunt impedance and the at least one shunt diode being operative to generate second-order distortion out of the input node as the predistortion and to generate substantially no third-order distortion; and a varactor circuit electrically connected in between the input node and the ground node, the varactor circuit comprising an adjustable impedance element in series with a varactor diode element, the varactor circuit being operative to generate additional second-order distortion in an offset phase relationship when compared to the second-order distortion generated by the shunt element.

12. The predistortion circuit of claim 11, wherein the adjustable impedance element further comprises an adjustable resistance element and a capacitive element, the level of the additional second-order distortion being associated with a value of the adjustable resistance element.

13. A method for generating predistortion having second-order distortion and substantially no third-order distortion from a static predistortion circuit, comprising the steps of:

generating an electrical signal;

providing the electrical signal to the static predistortion circuit;

applying a bias current to a static diode within the static predistortion circuit to generate the predistortion, the predistortion having at least the second-order distortion and the third-order distortion;

adjusting a level of the bias current to substantially eliminate generation of the third-order distortion; and adjusting a value of a static impedance within the static predistortion circuit to optimize generation of the second-order distortion in the predistortion so that the second-order distortion in the predistortion substantially cancels inherent distortion generated by a nonlinear device.

14. The method of claim 13, wherein the applying step further comprises applying the bias current to a Schottky-diode configured to generate the predistortion within the static predistortion circuit.

15. The method of claim 13 further comprising applying the electrical signal and the predistortion generated by the static predistortion circuit to the nonlinear device, the predistortion substantially canceling the inherent distortion generated by the nonlinear device.

16. The method of claim 15 further comprising applying additional predistortion generated by a dynamic circuit to the nonlinear device.

17. The method of claim 16 wherein the predistortion generated by the static predistortion circuit is concentrated in a lower frequency band and the additional predistortion generated by the dynamic circuit is concentrated in a higher frequency band.

* * * * *